(12) United States Patent
Heedt et al.

(10) Patent No.: US 11,737,377 B2
(45) Date of Patent: Aug. 22, 2023

(54) FABRICATION METHOD USING ANGLED DEPOSITION AND SHADOW WALLS

(71) Applicant: Microsoft Technology Licensing, LLC, Redmond, WA (US)

(72) Inventors: Sebastian Heedt, Würselen (DE); Marina Quintero-Pérez, Delft (NL); Francesco Borsoi, Delft (NL); Kevin Alexander Van Hoogdalen, Zoetermeer (NL); Leonardus Petrus Kouwenhoven, The Hague (NL)

(73) Assignee: Microsoft Technology Licensing, LLC, Redmond, WA (US)

( * ) Notice: Subject to any disclaimer, the term of this patent is extended or adjusted under 35 U.S.C. 154(b) by 106 days.

(21) Appl. No.: 17/429,300

(22) PCT Filed: Feb. 15, 2019

(86) PCT No.: PCT/US2019/018284
§ 371 (c)(1),
(2) Date: Aug. 6, 2021

(87) PCT Pub. No.: WO2020/167318
PCT Pub. Date: Aug. 20, 2020

(65) Prior Publication Data
US 2022/0149261 A1    May 12, 2022

(51) Int. Cl.
*H01L 39/08* (2006.01)
*H10N 60/83* (2023.01)
(Continued)

(52) U.S. Cl.
CPC ....... *H10N 60/83* (2023.02); *C23C 16/45536* (2013.01); *H01L 29/0669* (2013.01); *H10N 60/0801* (2023.02)

(58) Field of Classification Search
CPC .... H10N 60/83; H10N 60/0801; H10N 60/01; H10N 60/128; H10N 69/00;
(Continued)

(56) References Cited

U.S. PATENT DOCUMENTS

| 6,517,996 B1 | 2/2003 | Chao et al. |
| 10,629,798 B1 * | 4/2020 | Kallaher ................ H10N 60/10 |
| 2019/0042967 A1 | 2/2019 | Yoscovits et al. |

FOREIGN PATENT DOCUMENTS

| WO | WO 2019/001753 | 1/2019 |
| WO | WO-2019001753 A1 * | 1/2019 ............ B82Y 10/00 |
| WO | WO 2019/099171 | 5/2019 |

OTHER PUBLICATIONS

International Search Report and Written Opinion dated Aug. 1, 2020, from International Patent Application No. PCT/US2019/018284, 11 pp.

(Continued)

*Primary Examiner* — Ermias T Woldegeorgis
(74) *Attorney, Agent, or Firm* — Klarquist Sparkman, LLP

(57) ABSTRACT

A method of fabricating a device, comprising forming portions of electronic circuitry and a shadow wall structure over a substrate, and subsequently depositing a conducting layer over the substrate by angled deposition of a conducting material in at least a first deposition direction at an acute angle relative to the plane of the substrate. The shadow wall structure is arranged to cast a shadow in the deposition, leaving areas where the conducting material is not deposited. The shadow wall structure comprises one or more gaps each shorter than a shadow length of a respective part of the shadow wall structure casting the shadow into the gap, to prevent the conducting material forming in the gaps and to thereby create regions of said upper conducting layer that are electrically isolated from one another. These are (Continued)

arranged to form conducting elements for applying signals to, and/or receiving signals from, the electronic circuitry.

20 Claims, 9 Drawing Sheets

(51) Int. Cl.
*C23C 16/455* (2006.01)
*H01L 29/06* (2006.01)
*H10N 60/01* (2023.01)

(58) Field of Classification Search
CPC . H01L 29/0669; H01L 29/0673; H01L 29/20; H01L 29/7613; H01L 29/66984; H01L 29/66977; H01L 39/2493; H01L 39/223; H01L 39/025; G06N 10/00; B82Y 10/00
See application file for complete search history.

(56) References Cited

OTHER PUBLICATIONS

"Office Action Issued in European Patent Application No. 19707672.2", dated Jan. 4, 2023, 4 Pages.
"Office Action Issued in Indian Patent Application No. 202147034947", dated Mar. 15, 2023, 6 Pages.

* cited by examiner

FABRICATION METHOD USING ANGLED DEPOSITION AND SHADOW WALLS

CROSS REFERENCE TO RELATED APPLICATIONS

This is the U.S. National Stage of International Application No. PCT/US2019/018284, filed Feb. 15, 2019, which was published in English under PCT Article 21(2), and which is incorporated by reference herein in its entirety.

TECHNICAL FIELD

The disclosure relates to the formation of an electrically conducting layer by means of angled deposition, using shadow walls so as to leave shadowed areas where the conducting material is not deposited. The disclosed techniques have an example application in the fabrication of quantum computing devices comprising semiconductor-superconductor nanowires, or indeed other nanofabrication applications.

BACKGROUND

Topological quantum computing is based on the phenomenon whereby non-abelian anyons, in the form of "Majorana zero modes" (MZMs), can be formed in regions where a semiconductor is coupled to a superconductor. A non-abelian anyon is a type of quasiparticle, meaning not a particle per se, but an excitation in an electron liquid that behaves at least partially like a particle. An MZM is a particular bound state of such quasiparticles. Under certain conditions, these states can be formed close to the semiconductor-superconductor interface in a nanowire formed from a length of semiconductor coated with a superconductor. When MZMs are induced in the nanowire, it is said to be in the "topological regime". To induce this requires the application of a magnetic field to the nanowire, and also cooling of the nanowire to a temperature that induces superconducting behaviour in the superconductor material. It may also involve gating a part of the nanowire by applying a variation in an electrostatic potential.

By forming a network of such nanowires and inducing MZMs in parts of the network, it is possible to create a quantum bit (qubit) which can be manipulated for the purpose of quantum computing. A quantum bit, or qubit, is an element upon which a measurement with two possible outcomes can be performed, but which at any given time (when not being measured) can in fact be in a quantum superposition of the two states corresponding to the different outcomes.

SUMMARY

Conventionally, the fabrication process involves one or more "post-fabrication" steps after the formation of the nanowires in order to form related electrically conducting elements such as gates, leads and bond pads. This post-fabrication typically involves etching or lithography. However, the performance of semiconductor nanowire devices is prone to detrimental effects related to adsorbates and surface potential fluctuations. Standard lithography and other post-fabrication steps that are usually performed to create complex nanoelectronics devices can be harmful to the device performance. It would be desirable to create a process flow that involves as few steps as possible after the semiconducting nanowires have been introduced on the target device wafer, ideally circumventing electron-beam resists and physical or wet-chemical etching steps altogether.

Similar considerations could also apply to the fabrication of other types of semiconductor, quantum or electronic devices, where it may be also be desirable to reduce or even eliminate potentially damaging post-fabrication steps that would otherwise follow the formation of the active structures of the device themselves in order to form electrical contacts and the like. Other such example applications may include other types of quantum devices such as SIS junctions, SIN junctions, and SQUIDS; spintronic devices such as spin transistors, spin-based storage elements or spin-based sensing elements; or conventional semiconductor electronic devices.

According to a first aspect of the present disclosure, there is provided method of fabricating a device, comprising: forming portions of circuitry and a shadow wall structure over a substrate, and subsequently depositing an upper conducting layer over the substrate by angled deposition of a conductor such as a metal. E.g. this may be performed using vapour deposition. The angled deposition is performed in at least one deposition direction at an acute angle of elevation relative to the plane of the substrate, wherein the shadow wall structure is arranged to cast a shadow in the deposition process, leaving areas where the conductor is not deposited. The shadow wall structure comprises one or more gaps each shorter than the shadow length of the respective part of the shadow wall structure which casts the shadow into the gap, so as to prevent the conductor forming in the gaps during the deposition, and to thereby create regions of said upper conducting layer that are electrically isolated from one another. These electrically isolated regions are arranged to form conducting elements such as terminals and/or leads for applying signals to, and/or receiving signals from, one or more components of the electronic circuitry. For instance these components may comprise one or more semiconductor-superconductor nanowires, e.g. arranged to form a qubit. The conducting elements may be used e.g. to create gates for gating these nanowires, or bond pads for connecting leads for reading out the qubits, or internal conducting lines for connecting between components in the semiconductor layer, etc.

The shadow length is the extent, in the plane of the substrate in the direction of the deposition beam, of the shadow that would be cast by the respective part of the wall, given its height and the direction of deposition, if the shadow was not interrupted by the part of the wall structure on the other side of the gap. The fact that the gaps are shorter than the shadow length means that the metal is not deposited onto the underlying layer or substrate (the "floor" of the gap) in the areas between the walls enclosing gaps, thus ensuring electrical isolation. This technique can be used to form electrically conducting circuit elements such as bond pads, conducting lines and/or gates, and can thus reduce or even eliminate the need for damaging post-fabrication steps such as etching and lithography for this purpose. In some embodiments no etching or lithography steps are used to form any upper conducting layers after the formation of the semiconductor layer. In the case of semiconductor-superconductor nanowires, the conducting elements such as contacts and gates may be formed in the same deposition step (or one or more of the same deposition steps) as the superconductor coating of the nanowires.

According to a second aspect of the present disclosure, there may be provided a method of angled deposition comprising forming a vertical template perpendicular to a substrate. The vertical template comprises one or more holes, corresponding to one or more areas in the plane of the substrate over which said deposition is to be performed, given a direction of deposition at an acute angle relative to the plane of the substrate. The method then comprises depositing a material (e.g. a conductor such as a metal) through the one or more holes in said direction at said angle, thereby depositing the material over said one or more areas. The template may be placed around one or more sides of the substrate, to allow for deposition from one or more directions. The template may be left in place or removed when the device is capped.

The first and second aspects may be used together or independently. Any features disclosed or claimed in relation to the first aspect may optionally be used in conjunction with the second aspect and vice versa.

According to another aspect disclosed herein there is provided a device fabricated by the method of any embodiment of the first or second aspect.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the present disclosure and to show how such embodiments may be put into effect, reference is made, by way of example only, to the accompanying drawings in which.

DETAILED DESCRIPTION OF EMBODIMENTS

Figure 1A:
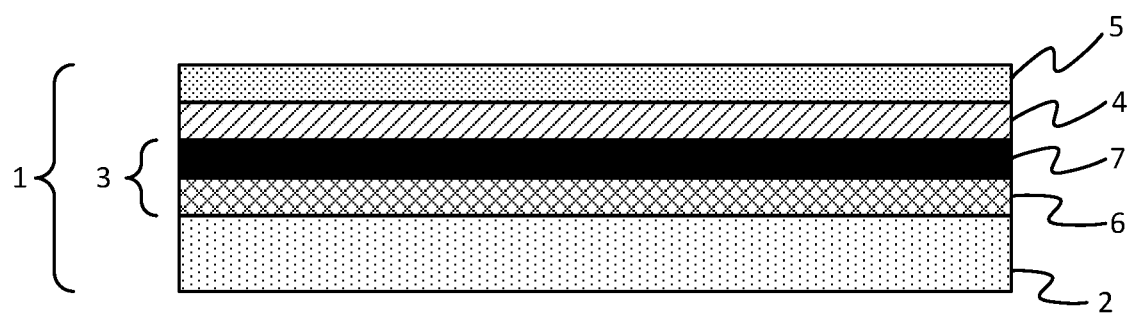
FIG. 1A is a schematic side view of an example wafer.

Embodiments disclosed herein provide a device design and fabrication flow for producing devices such as Majorana devices comprising semiconductor-superconductor nanowires, or other hybrid superconductor-semiconductor devices. The flow reduces or even eliminates the need to perform any fabrication steps after the deposition or growth of the nanowire(s) and angled evaporation of the metal on the nanowires. The semiconductor (e.g. nanowire cores) may be grown for example by selective area growth (SAG) or vapour-liquid-solid (VLS) growth. However, conventional etching or lithography that are traditionally used to define structured electrical contacts and other such conducting elements after semiconductor growth and subsequent metal deposition can damage the underlying structure. Thus reducing or eliminating such steps will increase the performance of such devices. The disclosed fabrication flow generates devices that include elements such as gates, leads, high-quality dielectric, and/or pads for bonding, etc. After the growth or deposition of the nanowire core, metal is deposited to create the semiconductor-superconductor hybrid needed for the qubits (this step is always needed). This metal needs to be selectively deposited only in some areas of the nanowire. To create this selective deposition, one could perform blanket metallic deposition and then locally etch the metal where not wanted, but this is an example of a fabrication step that will damage the device. Embodiments disclosed herein solve the problem of etching, fabricating gates and contacts, thus eliminating every fabrication step after the metal deposition.

In a first aspect, the solution utilizes a unique design of shadow walls with specially formed gaps in between that allow for electrical isolation of contacts to the wire and prevent the occurrence of shorts that would otherwise be created by angled blanket deposition of metals. Preferably the walls form "pockets" or enclosures in the plane of the substrate, with one or more of the gaps in the walls of each pocket. Each pocket thus encloses its own respective isolated region. In a second aspect, which may be used together with the first aspect or independently, the flow uses metal deposition through a vertical hard mask template patterned with holes to prevent that large areas of the chip are shorted by a metal film.

As mentioned, the performance of semiconductor nanowires is prone to detrimental effects related to adsorbates and surface potential fluctuations, e.g. due to the intrinsically large surface-to-volume ratio. Standard lithography and other post-fabrication steps that are usually performed to create complex nanoelectronics devices (for instance hybrid semiconducting-superconducting devices that function as topological qubits) can be harmful to the device performance (e.g. due to low thermal budget). Post-fabrication is defined herein as any steps after the angled metal deposition (or more generally the angled deposition of the conducting material). It may comprise the series of cleanroom fabrication steps that would conventionally occur after either the wire growth in the case of SAG wires, or wire deposition on the substrate in case of VLS. It would be desirable to create a process flow that involves as few steps as possible after the semiconducting nanowires have been introduced on the target/device chip, ideally circumventing electron-beam resists and physical or wet-chemical etching steps altogether.

This problem is particularly (but not exclusively) relevant in hybrid semiconductor-superconductor structures where the semiconductor comprises InSb and the superconductor comprises Al. Since InSb/Al is a very delicate material combination, then heat, aging, etching, or other traditional fabrication processes can affect the material quality and the InSb/Al interface, generating inter-diffusion or defects and hindering Majorana signatures. Embodiments disclosed herein provide a device design and fabrication flow that shifts all device fabrication steps to prior to the growth or deposition of the InSb structure and subsequent metallization.

Stencil masks would be an alternative solution to obtain a device that requires no fabrication after metal deposition. However, stencil masks require very precise mechanical positioning of the mask, which requires the introduction of complex additional machinery in the deposition chamber.

Further, for each new deposition a new stencil mask is required (typically multiple depositions are needed for a single device). The presently disclosed solution on the other hand uses selective deposition of shadow walls, e.g. by lithographic positioning of the walls, followed by angled deposition of the metal or other such conductor. This is both more accurate and easier.

Embodiments provide a design of shadow walls that includes pockets and gaps that allow to create multiple isolated structures (e.g. contact leads, gates, dielectrics, and/or mesoscopic metallic structures) using directional deposition. One benefit of this design for metallic deposition, or deposition of other conductors, is that these structures are not electrically shorted to each other or the outside environment, as would be the case when using angled blanket directional deposition without these designs.

Embodiments also provide a technique of metal directional deposition through a vertical hard mask template selectively patterned with holes to prevent that large areas of the chip are shorted by a metallic film. Moreover, this enables capping the device from the top via blanket deposition of a dielectric.

The following describes a fabrication flow which generates devices that include gates, leads, high-quality dielectrics, and pads for wire bonding. The flow is described in relation to the fabrication of a quantum computing device comprising a network of semiconductor-superconductor nanowires for forming MZM-based qubits. However more generally, the designs and fabrication flows presented herein may be used to create various different types of device without any post-fabrication steps. Such devices may include quantum devices such as semiconductor-insulator-semiconductor (SIS) junctions, semiconductor-insulator-normal (SIN) junctions, islands, superconducting quantum interference devices (SQUIDs), and/or superconducting flux/phase/charge qubits.

FIG. 1A illustrates an example device (or part thereof) formed in accordance with embodiments disclosed herein. The device comprises a wafer 1 comprising a substrate 2 and multiple layers formed over the substrate 2. The multiple layers comprise at least a first layer 4 comprising patterned portions of electronic circuitry, and an upper conducting layer 5 comprising patterned portions of conductor. The first layer 4 may also be referred to as the active layer, in that this is where functional parts of the electronic components are formed (be they quantum components, spintronic components or traditional electronic components). In embodiments the first layer 4 comprises a semiconductor layer comprising patterned portions of semiconductor. For instance the semiconductor may be InSb or InAs. Examples herein may be described in terms of a semiconductor layer 4, but this layer 4 may alternatively or additionally comprise one or more types of material such as a dielectric.

Note the term "circuitry" as used herein does not necessarily imply any particular kind of device, logic or electronic phenomenon unless stated otherwise. For instance it may refer to quantum devices based on any quantum phenomenon (e.g. MZMs, superconducting quantum interference, etc.); or spintronic circuitry (e.g. spin transistors, spin-based sensing or storage elements, etc.); or traditional electronics (e.g. transistors, diodes, capacitors, etc.). A "portion" of circuitry may refer to a single continuous element of material or multiple elements. A given portion may form a complete electronic component in its own right, or a constituent part of a component in conjunction with one or more elements in one or more upper and/or lower layers (e.g. an upper and/or lower conductor 5, 6).

The upper conductor 5 may be a superconducting metal such as Al. The semiconductor layer 4 is formed over the substrate 2, e.g. by selective area growth (SAG) or vapour-liquid-solid (VLS) and subsequent deposition over the substrate 2. Various fabrication techniques for forming semiconductor structures are, in themselves, known in the art. Subsequently the upper conducting layer 5 is formed over the semiconductor layer 4. This is formed by means of an angled deposition technique performed in accordance with the teachings of the present disclosure. In embodiments the medium for the disposition is vapour deposition.

Optionally, in embodiments the wafer 1 may further comprise a bottom structure or lower structure 3. This may comprise a lower conducting layer 6, and/or a lower dielectric layer 7. In embodiments the lower conducting layer 6 is formed over the substrate 2 and the lower dielectric layer 7 is subsequently formed over the lower conducting layer. In other embodiments, these lower layers 6, 7 could be applied in the opposite order, and/or only one of these lower layers 6,7 may be present, and/or one or more other layers (not shown) may be included in the bottom structure. In embodiments the lower conducting layer 6 may comprise for example gold, tungsten or silver. The lower dielectric layer 7 may be formed from any suitable dielectric, e.g. $SiO_2$ or $SiO_x$. Any suitable fabrication technique may be used to form these layers 6, 7 such as vapour deposition or lithography. Various materials and fabrication techniques for forming conducting and dielectric layers 6, 7 are, in themselves, known in the art.

The semiconductor layer 4 may comprise various functional electronic circuit portions. In embodiments these may comprise one or more quantum computing components used to form qubits or the like. E.g. the semiconductor layer 4 may comprise the semiconductor cores of a network of semiconductor-superconductor nanowires arranged to form MZM-based qubits.

Figure 1B:
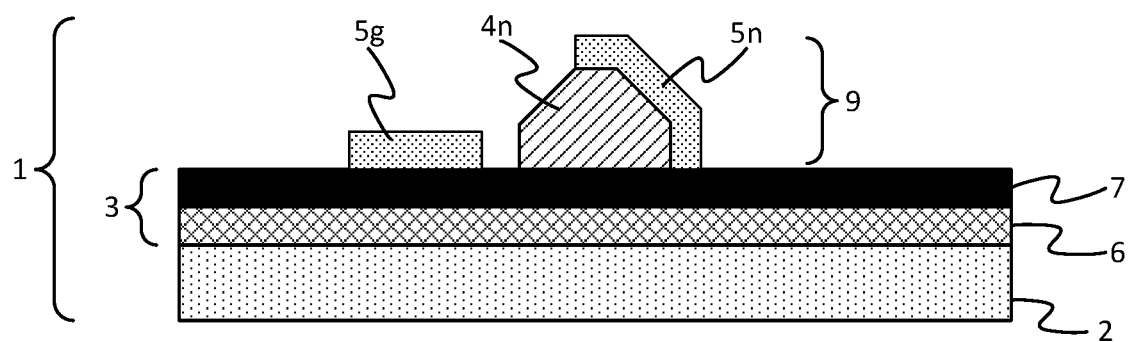
FIG. 1B is a schematic cross section through an example nanowire.
Figure 1C:
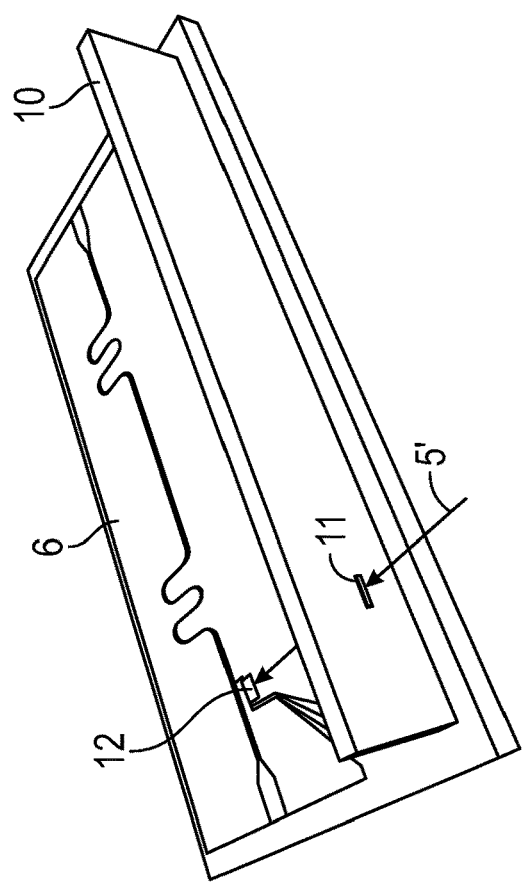
FIG. 1C is a schematic perspective view showing use of an example vertical template.
Figure 1C:
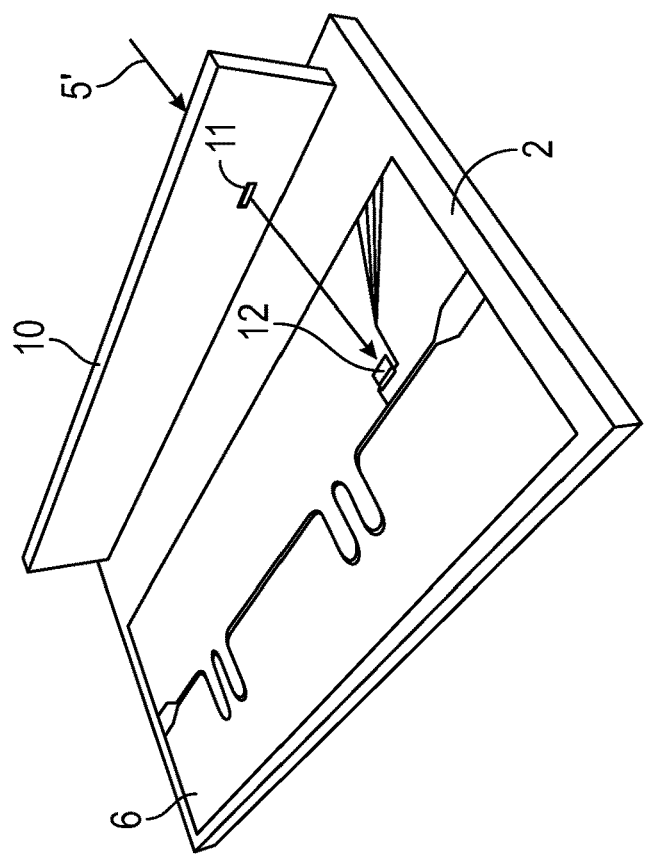

FIG. 1B schematically illustrates an example structure that may be formed in the semiconductor and upper conducting layers 4, 5. Here the structure comprises a semiconductor-superconductor nanowire 9, shown in cross section perpendicular to its axis in FIG. 1B (i.e. with the length of the nanowire 9 running perpendicular to the page). The nanowire 9 comprises a length of semiconductor $4n$ forming the core of the nanowire 9, and a coating of superconductor $5n$ formed at least part way round the semiconductor core $4n$. The superconductor coating $5n$ may be formed directly on or indirectly over the semiconductor core $4n$ (e.g. there may be a ferromagnetic insulator, not shown, disposed between at least part of the superconductor coating $5n$ and the semiconductor core $4n$).

The structure also comprises one or more associated conducting elements such as electrical contacts, leads and/or signal terminals formed in the conducting layer 5, such as a gate $5g$ for applying an electrostatic potential to the nanowire 9.

As will be familiar to a person skilled in the art, majorana zero modes (MZMs) can be induced in a semiconductor-superconductor nanowire 9 by cooling the device 1 to a temperature at which the superconductor $5n$ exhibits superconducting behaviour, and applying a magnetic field to the nanowire 9. The magnetic field may be applied from a source external to the device 1, e.g. an external electromagnet; and/or may be applied by means of a magnetic element integrated into the device 1 itself, e.g. a ferromagnetic insulator (not shown) formed on at least part of the nanowire core $4n$. Inducing an MZM typically also involves gating, i.e. applying an electrostatic field to the nanowire $5n$ via a suitable gate element 5g. However, it is also possible to induce MZMs without gating using full-shell nanowires (having a superconducting coating all the way round the nanowire's circumference). Techniques for inducing MZMs in nanowires are, in themselves, known in the art. In the illustrated example the gate is a side gate 5g, but a top gate or bottom gate formed in the lower conducting layer 6 are also a possibility.

One nanowire 9 is shown in FIG. 1B for illustrative purposes, but it will be appreciated that, depending on the device being fabricated, there may be more present (as well as associated conducting elements in the upper conducting layer 5, and any associated structures in the lower conducting layer 6 and/or dielectric layer 7). A network of such nanowires 9 formed in the plane of the substrate 2 can be arranged to form a qubit or a quantum computing device comprising a plurality of such qubits. Arrangements for forming qubits and quantum computing devices from networks of nanowires are, in themselves, known in the art.

The upper conducting layer 5 comprises various electrically conducting elements which may be used to form contacts with ones of the electronic components formed in the semiconductor layer 4, and/or to apply an electrical potential to such components. E.g. these may include internal conducting wires (lines) connecting between different components in the semiconductor layer 4, and/or terminals such as gates 5g for gating components such as the nanowires 9. Some of the terminals may comprise bond pads for connecting external leads to the device 1, enabling signals to be applied to the device 1 or read out from the device from an external equipment such as an external computer system (not shown). E.g. signals from room temperature electronics may be applied to the leads and gates via the bond pads.

Preferably, as will be discussed in more detail shortly, according to embodiments disclosed herein, the superconductor coating 5n may be formed in the same deposition step (or at least one of the same steps) as the other conducting elements such as the gates 5g, bond pads 5b, and/or conducting lines, etc.

Optionally one or more other layers may be included. For instance, part or all of the semiconductor layer 4 may be separated from the conducting layer 5 by an intermediate dielectric layer (not shown) to create one or more gates. And/or, one or more further, upper layers (not shown) of the wafer 1 may be formed over the upper conducting layer 5, e.g. an oxide layer to protect from oxidation, and/or an encapsulating dielectric layer. And/or, one or more further or alternative lower layers (not shown) may be included in the lower structure 3.

Note that the described process does not exclude the possibility of additional pre-fabricated bond pads. E.g. it may be advantageous to already have relatively thick metal pads in place, facilitating the wire bonding, cf. 5b in FIG. 6. E.g. this may be formed in the lower layer 6.

Note also again that the FIGS. 1A and 1B are schematic and the shapes and dimensions shown therein are not intended to be limiting. E.g. in embodiments the nanowire 9 may in fact be hexagonal in cross section.

On a point of terminology, the "substrate" 2 herein refers to the ultimate base of the wafer 1, and the "wafer" refers to the base plus any additional layers formed on or over the substrate 2 at any point in the fabrication or in the final finished wafer. "Over" herein may mean either formed directly on, or indirectly over with any one or more intermediate layers in between. So "over" the substrate herein may mean either formed directly on the substrate 2, or with one or more intervening layers such as a dielectric layer between the substrate 2 and the semiconductor 4. "On" herein means directly on, i.e. in contact with, without any intermediate layer. Neither term necessarily implies that one layer is formed across the entirety of the underlying layer. Note also that the terms "on" or "over", "upper" and "lower", "horizontal" and "vertical", or such like, as used herein, do not necessarily imply a particular orientation relative to gravity. Rather, they refer to the position relative to the surface of the substrate 2 that is being worked (the surface upon which the formation of layers begins). Note also that "upper" and "lower" are merely relative terms, and do not necessarily imply that any layers referred to by these terms are the absolute uppermost or lowermost layers of their type. Also the mention of an "upper" conducting layer 5 does not necessarily imply the presence of a lower conducting layer, and the mention of a lower dielectric layer 7 does not necessarily imply the presence of an upper dielectric layer. Further, the term "layer" does not necessarily imply a continuous or unbroken layer and can also refer to a patterned or structured layer. Furthermore, any given pair of the various different layers 2-7 are not necessarily separated by a flat horizontal plane as they are represented schematically in FIG. 1A. E.g. as shown by way of example in FIG. 1B, parts of the metal layer 5 can "wrap" or descend downwards over structures in the semiconductor layer 4, or similarly in any pair of adjacent layers.

Once fabrication is complete, the wafer 1 is packaged into an integrated circuit (IC) package using known IC packaging techniques. The packaging may comprise inserting leads connecting between the external connectors (e.g. pins or ball pads) of the package and the internal bond pads 5b (shown later) formed in the upper conducting layer 5, thus enabling the external equipment to control or read out from the semiconductor components in the semiconductor layer 4. The packaging may comprise covering the wafer and leads with a suitable encapsulant, typically a dielectric, examples of which will be known in the art.

An example fabrication process flow in accordance with embodiments of the present disclosure is now discussed with reference to FIGS. 1 to 7. By way of illustration these will be described in relation to the example where the deposited metal 5 is a conductor, e.g. a superconductor such as Al for forming the coating 5n of the nanowires 9, and the lower conducting layer 6 is also formed from a metal, e.g. gold or tungsten. However it will be appreciated that this is not limiting.

FIG. 1 illustrates a stage where the lower structure 3 has already been formed over the substrate 2. In embodiments, the semiconductor 4 and upper conducting layer 5 are only to be formed on one or more selected, active circuit areas 12, and not other areas over the substrate 2. One such area 12 is illustrated in FIG. 1 but there could also be more present. The dielectric 6 may also only be formed in this layer. The other areas outside the selected areas may be used for other purposes. E.g. the metal layer 6 in such other areas could be patterned to provide a coplanar waveguide resonator to read out a qubit formed in the selected area 12. Alternatively the other areas could simply be left as non-functional areas.

The deposition of the conductor 5 (e.g. metal) is performed by angled vapour disposition, whereby a beam of vapour 5' comprising the conducting material being deposited is directed toward the substrate, e.g. by electron-beam physical vapour deposition, chemical vapour deposition, or plasma-enhanced chemical vapour deposition. The arrow labelled 5' represents deposition of the conductor (e.g. metal) under a steep angle. The angle of deposition is at least acute relative to the plane of the substrate 2, i.e. a nonperpendicular angle in between the normal to the plane of the substrate 2 and the plane of the substrate 2. Preferably the angle is less than 45 degrees relative to the plane of the substrate (greater than 45 degrees to the normal), and in embodiments may be much less, e.g. less than 22.5 degrees, or less than 12.25 degrees. The particular desired angle may depend on the geometry of the SAG or VLS wire. The relevant condition may be that the deposition must enable an electrical connection via the substrate (or a metallic loop running across the substrate connecting several semiconductor segments). The actual angle depends on the facets of the nanowire. For a hexagonal nanowire cross-section the maximal deposition angle to the plane of the substrate is 60 degree. In reality it may be beneficial to use a steeper angle than that to ensure proper coverage of the lowest hexagon facet. For instance embodiments use 30 degrees.

In embodiments, the substrate 2 is provided with a vertical hard mask template 10 placed on at least one side of the substrate 2. The template comprises one or more holes 11, each corresponding to a respective one of the selected deposition regions 12. The evaporated material 5' is deposited through the hole(s) 11 so as to only form on the corresponding areas 12 over the substrate 2. The template 12 can be fabricated for example by 3D printing on the chip 1, e.g. from special resins, or it could be a thin patterned Cu mask placed on top of the chip (it can be included into the sample clamp to ensure accurate alignment between the sample and the template). The position, size and shape of these areas 12 is a function of the size and position of the holes 11, and the direction of deposition including the angle of deposition. The purpose of the template structure 10 is to prevent that large areas of the chip 1 are covered by a metal film 5 during metal deposition. The vertical template 10 enables coarse structuring of the deposited metal film 5. However, in alternative embodiments, other suitably focused beam-based vapour deposition techniques could be used that do not involve the template 10; though a template may be preferred to achieve the desired accuracy if the area 12 (or any of the areas 12) is smaller than 100×100 µm² (or smaller than 100 µm in any dimension in the plane of the substrate).

In the example illustrated, the depicted coplanar waveguide resonator has been fabricated in the lower metal layer 6 prior to the nanowire deposition. Only the area 12 on the chip 1 is covered selectively with metal during the deposition process.

If deposition is required from multiple angles, several vertical hard mask templates 11 may be placed on different sides of the substrate. In embodiments, the vertical template may contain holes 11 that are approximately 100 µm wide and may have an inclination that equals the evaporation angle.

The holes 11 in the vertical template 10 are positioned such that metal is only selectively deposited in the vicinity of the nanowire devices. In embodiments, this allows for example to incorporate the nanowire devices into coplanar waveguide resonators for qubit readout and two-qubit entanglement. In embodiments the vertical template structure 10 can be left in place when the overall device is finally capped and packaged into an IC package. Since the hard mask template 10 is oriented vertically the final device can be protected after the deposition of the metallic leads by in situ capping with a dielectric layer. Thus, the devices are protected from degradation when exposed to air, preserving high quality. However, this is not essential and in alternative embodiments the template structure 10 may be removed before encapsulation.

Within a given deposition area 12, the metal 5 may be patterned by means of a structure of shadow walls 13, also called "smart walls". These are shown in FIGS. 2-7, to be discussed in more detail shortly. In embodiments the shadow walls 13 are formed from a dielectric material. Preferably these walls 13 are formed before growth of the semiconductor layer 4 to avoid possible damage caused by the processing involved in forming the shadow walls 13. However it is not excluded that they could be formed after the semiconductor 4.

Figure 2:
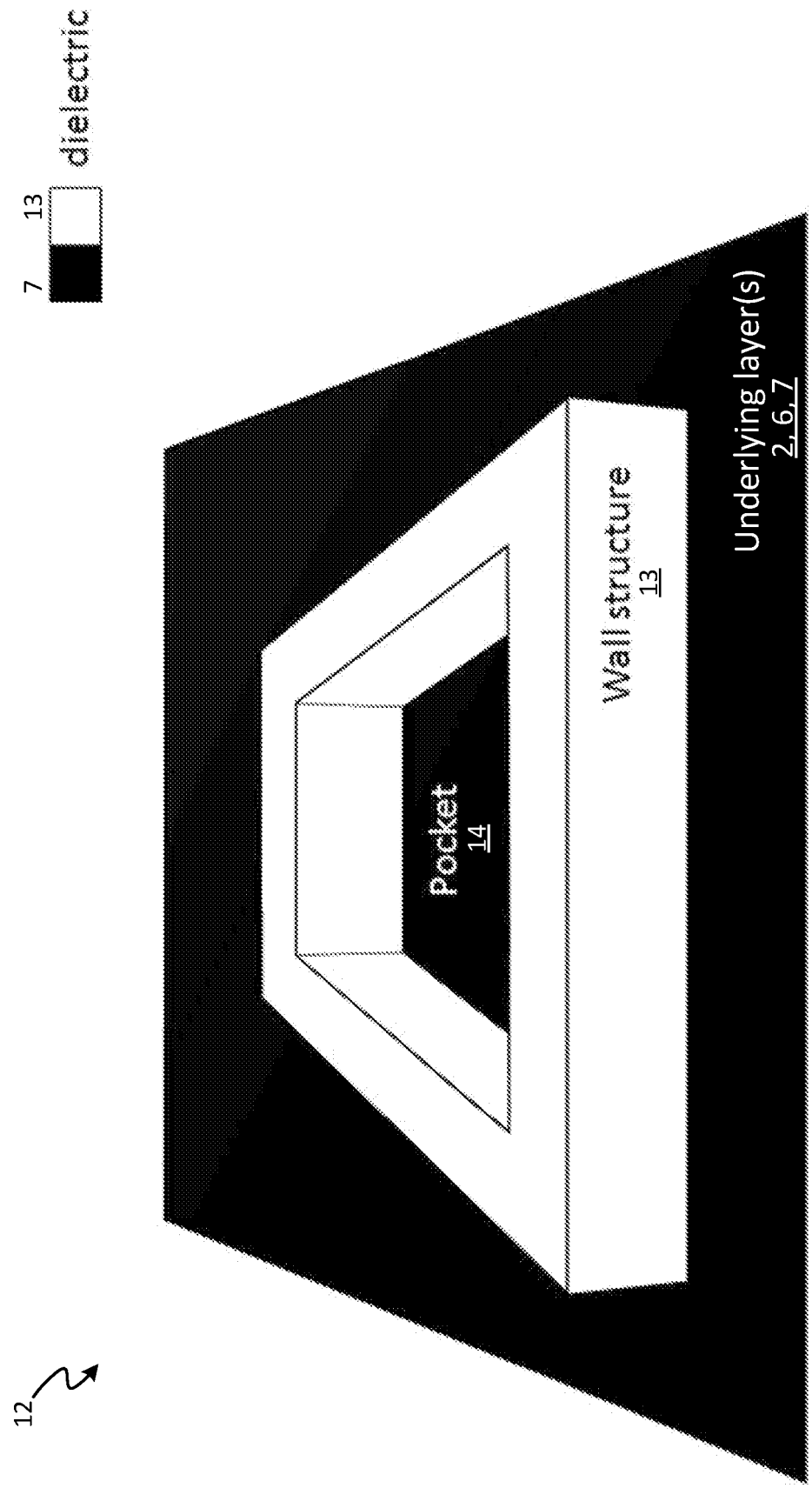
FIG. 2 is a schematic elevated view of an example wall structure.
Figure 3:
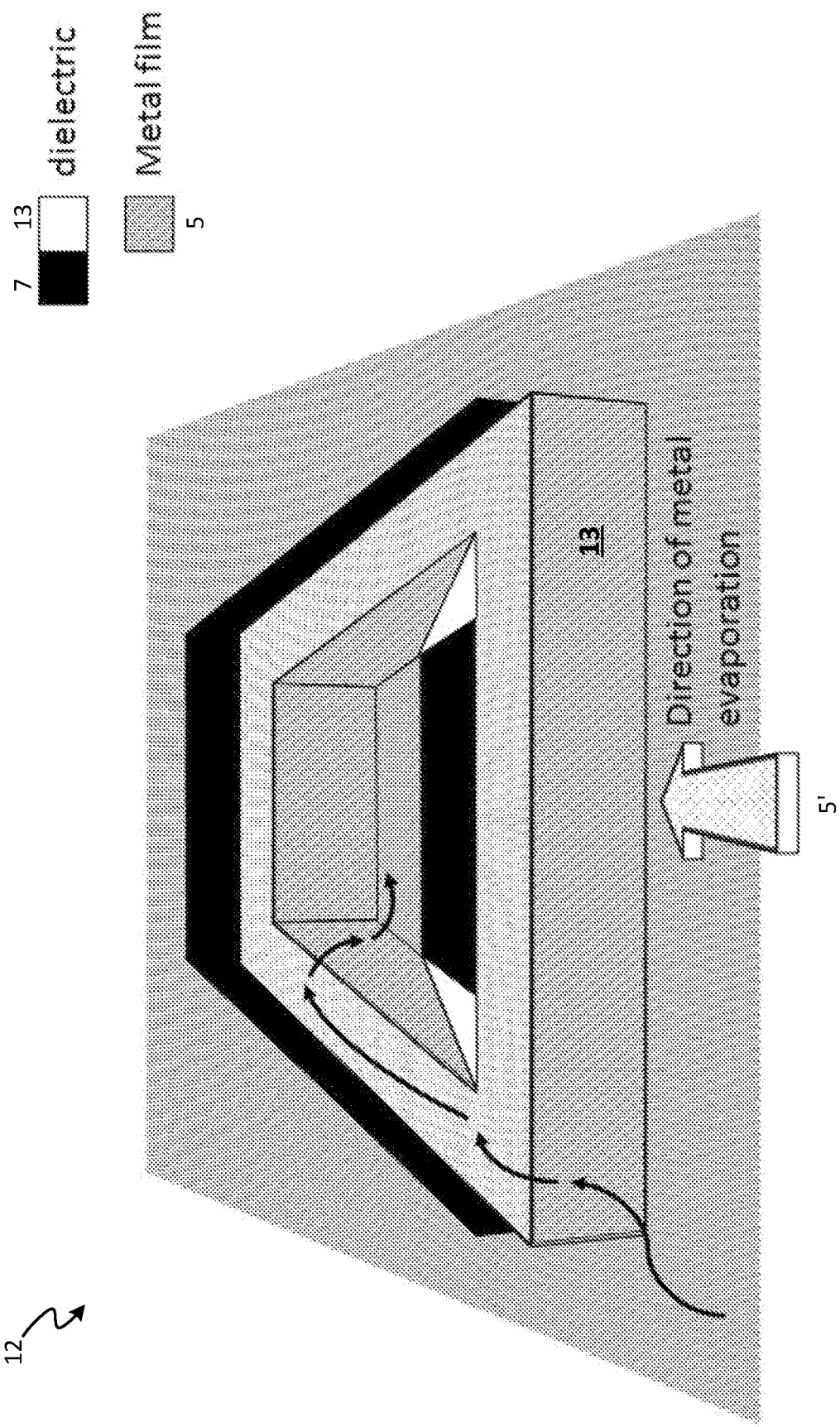
FIG. 3 is a schematic elevated view of angled disposition over an example wall structure.
Figure 4:
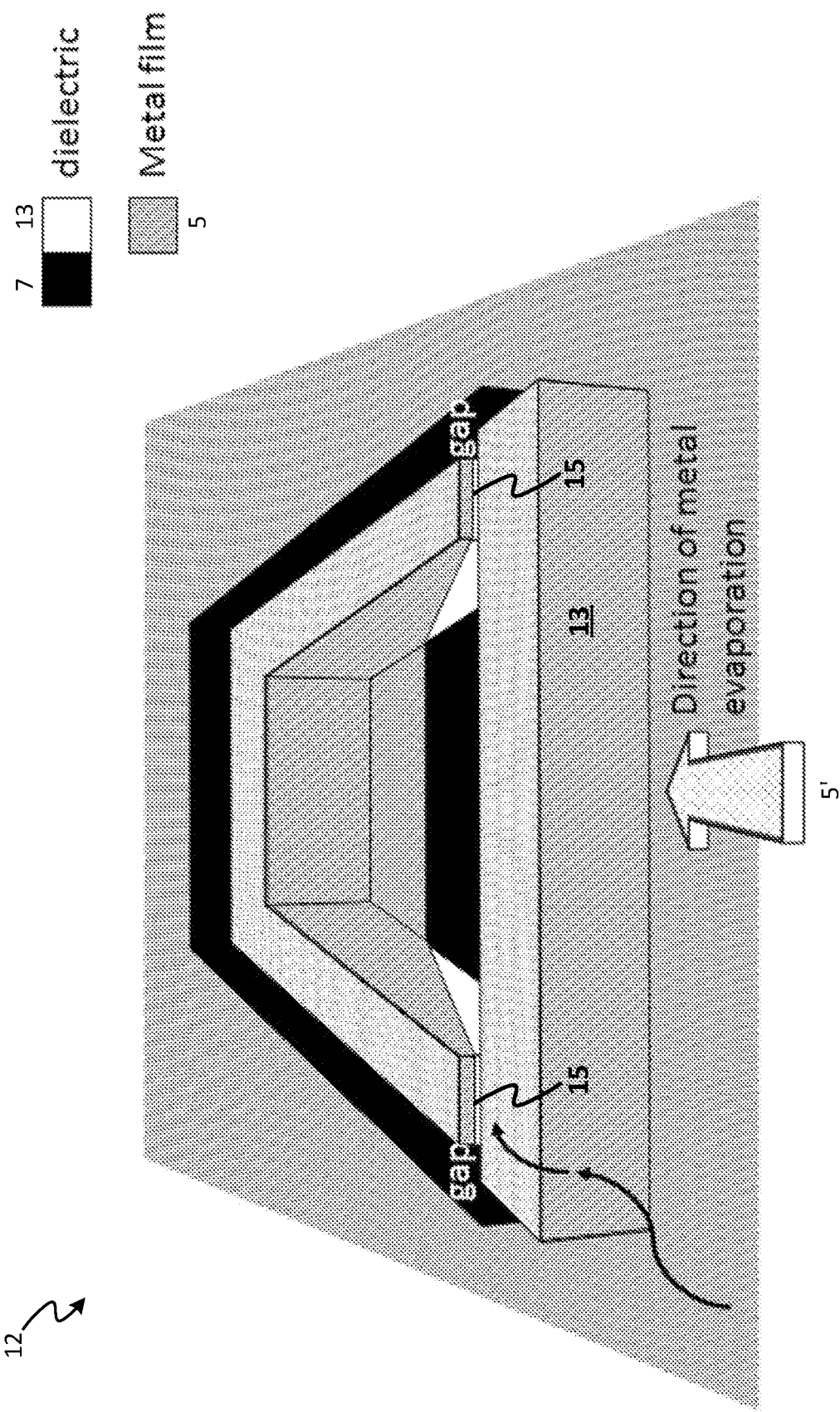
FIG. 4 is a schematic elevated view of angled disposition over another wall structure.

The basic, general idea of shadowing is known. However, the original shadow wall idea was aimed only at removing the need to do local patterning near the device area. The inventors have found that, when using the smart walls without the additional features presented herein, then much etching is still required to create a device that has multiple metallic sections, which must be completely electrically-isolated from each other (such as is needed when connecting leads to the device). This means that the smart walls by themselves are not enough to create a device without post-fabrication. The problem is illustrated in FIGS. 2-3. The disclosed solution uses gaps 15 to inherently pattern electrically isolated pockets of metal as illustrated in FIG. 4 and described below.

FIG. 2 illustrates an example of a "pocket" structure 14 defined by shadow walls 13. FIG. 2 represents a simplified version of a potential pocket structure made of walls 13 and fabricated on a dielectric layer 7 or substrate 2. In this example the pocket 14 comprises a region enclosed by the wall structure 13 on all sides. FIG. 2 illustrates a particular structure that may be formed inside part of one selected deposition area 12 in FIG. 1 (so the scale in FIG. 1 is much larger than in FIG. 2, and indeed FIGS. 3-7). By way of contrast with the ideas disclosed herein, the walls 13 of the pocket structure in FIG. 2 do not comprise any gaps.

FIG. 3 shows the pocket structure of FIG. 2, without gaps, after the metal deposition by the angled evaporation technique. The arrow labelled 5' represents the direction of metal evaporation, i.e. the deposition direction. The pocket becomes shorted to the outer film via the depicted path around the walls, so there is no electrical isolation.

To elaborate, when metal vapour 5' is deposited at the angle shown by the large arrow in FIG. 3 (e.g. <45° with respect to the sample horizontal), the walls 13 will cast a shadow over the substrate that can be seen in black. This disconnects most regions where the outer film 5 could contact the inner pocket area 14. Nevertheless, there are still regions where the metal 5' climbs the wall 13 vertically from the deposition direction and continues horizontally on top of the wall 13, where it will eventually find its way down to the pocket. Put another way, the metal vapour 5' will "creep" over the wall 13. As the resulting metal film 5 is then deposited on the top of the walls 13, and the inner sides of the walls 13 within the pocket 14, and furthermore on the floor of the pocket 14, this means electrical contact is made between the metal 5 inside and outside of the pocket (i.e. they are shorted). The arrowed path in FIGS. 3 (and 4) depicts an example electronic path of charge carriers in the film 5 (not a direction of the metal vapour 5'). Here it can be seen that, in the case of FIG. 3, there is a path connecting the outer film with the inside of the pocket 14. Hence the deposited film 5 inside the pocket 14 cannot be used as an isolated electrical contact such as, say, a bond pad for connecting between the lower conducting layer 6 and a lead. Therefore this pocket structure 13 is not, without modification, suitable for forming such contacts.

To prevent this problem, a disruption can be added to the pocket-wall structure in the form of gaps 15, as shown in FIG. 4. FIG. 4 shows a pocket structure 14 after metal evaporation, similar to FIG. 3, but with gaps 15 in the walls 13. Incorporating gaps 15 in the structure prevents an electrical connection around the walls 13. The inside of the pocket 14 is electrically isolated from the outer film.

Thanks to these gaps 15, the film is not continuous on top of the walls 13. The size of such gaps 15 is by design small enough to not allow any metal inside the gap for the desired evaporation angle, achieving with this full electrical isolation of the pocket 14 with respect to the outer film. The shadow length of a given part of the wall structure 13 is the extent of the shadow which that part of the wall structure would cast, extending out from that part of the wall structure, projected onto the plane of the substrate 2, if not interrupted by the wall on the other side of the gap 15. It is a function of not just the height and shape of the relevant part of the wall structure 13 itself, but also the deposition direction, including the polar angle of the disposition direction. In other words, the gap 15 is short enough that the metal (or other conducting material) that is being deposited does not hit the bottom of the gap 15.

The inventors have discovered that as long as the gap 15 is kept shorter than the shadow length of the part of the wall structure 13 forming that shadow, then the metal vapour 5' will not fall onto the floor of the gaps 15. The effect is a geometric one: the angle of the deposition is not steep enough that the deposited beam 5', projected onto the plane of the substrate 2, can reach the bottom of the gap 15 before hitting the side of the opposing wall 13 on the far side of the gap. If the gap 15 is larger than the shadow, metal 5' would fall inside the gap 15, onto the floor of the gap 15 (substrate 2 or underlying layer 6/7). In that case, the resulting metal film 5 outside the pocket 14 in FIG. 4 would then be connected to that inside of the pocket via the floor inside the gap 15 (not via the wall in this case, but still connecting the outer metallic film with the metal inside the pocket 14).

Thus unlike in FIG. 3, the metal film 5 deposited inside the pocket 14 of FIG. 4 is electrically isolated from the metal film 5 deposited outside the pocket 14. This means the deposited film 5 inside the pocket 14 can be arranged as an isolated electrical contact for controlling or reading out from one the components of the device.

E.g. the metal film 5 deposited inside the pocket 14 may be arranged as a bond pad for connecting a lead and the lower conducting layer 6, which may vicariously connect on to other active components such as one of the semiconductor components in the semiconductor layer, e.g. the nanowire. In embodiments, in order to connect to the nanowire 9, an opening may be formed extending from the base to the top of the wall, in the furthest wall 13, assuming the nanowire is located outside of the pocket 14 (see also FIGS. 5 and 6, discussed in more detail shortly). Alternatively a connection to the nanowire 9 could be formed via the lower conducting layer 6.

As another example, the metal film 5 deposited inside the pocket 14 may be arranged as a gate for gating a nanowire 9. In this case, the gate may be separated from the nanowire by a dielectric, but applies an electrostatic potential to the nanowire 9 which propagates through the dielectric. The gate may be controlled via a connection between the metal film 5 in the pocket 4 and the lower conducting layer 6. In embodiments this may be done by bonding through the dielectric layer 7 in between. In one possibility, the gate could be formed from the metal film 15 inside the pocket 14 and the dielectric could be formed from the wall 13 itself.

However, given the fact that in embodiments the walls 13 are much larger than 100 nm, this would allow only for very weak coupling to a gate electrode. A more preferable realization for a gate would be by means of a patterned layer 6 covered with a thin dielectric layer 7. These "bottom gates" can be efficiently coupled to the semiconductor (allowing for more pronounced changes in the electrostatic potential) as the gate is very close to the semiconductor channel. This gate could be connected to the film 5 inside a pocket 4 to enable electric connection to another component or an external source.

Note that the shape of the walls 13 in FIGS. 2-4 is a trapezoid, as is reflected in the shapes of the shadows in FIGS. 3 and 4. The trapezoid has two parallel walls 13 (the bases of the trapezoid) and two non-parallel walls (the sides or legs of the trapezoid). The longest base of the trapezoid is arranged as a front wall substantially facing the direction of deposition (the first wall 13 of the pocket 13 to be met travelling in the direction of deposition), whilst the shortest base of the trapezoid is arranged as a rear wall behind the front wall (the last wall of the pocket 14 to be met travelling in the direction of deposition). The bases are preferably substantially perpendicular to the deposition direction. The side walls 13 taper inwards from the front wall to the back wall, at an angle in the plane of the substrate 2 that is steeper than parallel to the deposition beam direction. Hence the regions behind the side walls get shadowed.

A trapezoidal shape is advantageous since it allows for tolerance in the azimuthal angle of evaporation. In the case of rectangular walls, if the evaporation comes slightly from the side, the metal 5'/5 will cover the outer side of the walls. This is however not necessarily detrimental, since the gaps can be adjusted accordingly. The rectangular shape is only a problem if the deposition is not perfectly directional. If a wall 13 is completely straight and parallel to the deposition direction, which is also perfectly directional (or close enough), then the metal vapour would not deposit on the sides of the wall, since the impinging flux on that wall equals zero. Nonetheless, by having trapezoidal shapes, one can know for sure on which of the two side walls the metal is evaporated even in the presence of an imperfectly directional beam.

A similar effect can be achieved with other pocket shapes having a front wall wider than the back wall and one or more side walls that taper backwards along at least part of the length. E.g. see the pocket shape shown in FIG. 6, to be discussed in more detail shortly.

FIG. 5 illustrates another example of the trapezoidal pocket shape. Here the pocket is used to form a contact to a nanowire 9 (a nanowire 9 may require both a gate and a contact to the superconducting coating 5n in order to operate as part of a qubit). Panel a) shows a layout of shadow walls 13 and semiconductor core 4n of a nanowire, all formed over the substrate 2 and any intermediate layers 6, 7 of the lower structure 3. One pocket 14i has its longest base arranged as a front wall facing a first deposition direction, being the direction of deposition of a first beam of metal vapour 5'. The shortest base (rear wall to the first direction) has an opening 16 which opens out onto part of the nanowire core 4n. When the first beam of metal 5' is deposited, as shown in panel b), it not only forms a contact such as bond pad 5b in the pocket 14, but also passes through the opening 16 and coats the corresponding part of the nanowire core 4n to form the superconducting coating 5n (assuming the deposited metal is a suitable superconductor such as Al). Via the material deposited in the opening 16, this also makes electrical contact between the film 5 in the pocket 14 and the nanowire coating 5n. Thus the superconductor coating 5n of the semiconductor-superconductor nanowire(s) 9 can be formed from the same deposition step as the rest of the angled metal deposition.

Figures 5A, 5B, 5C:
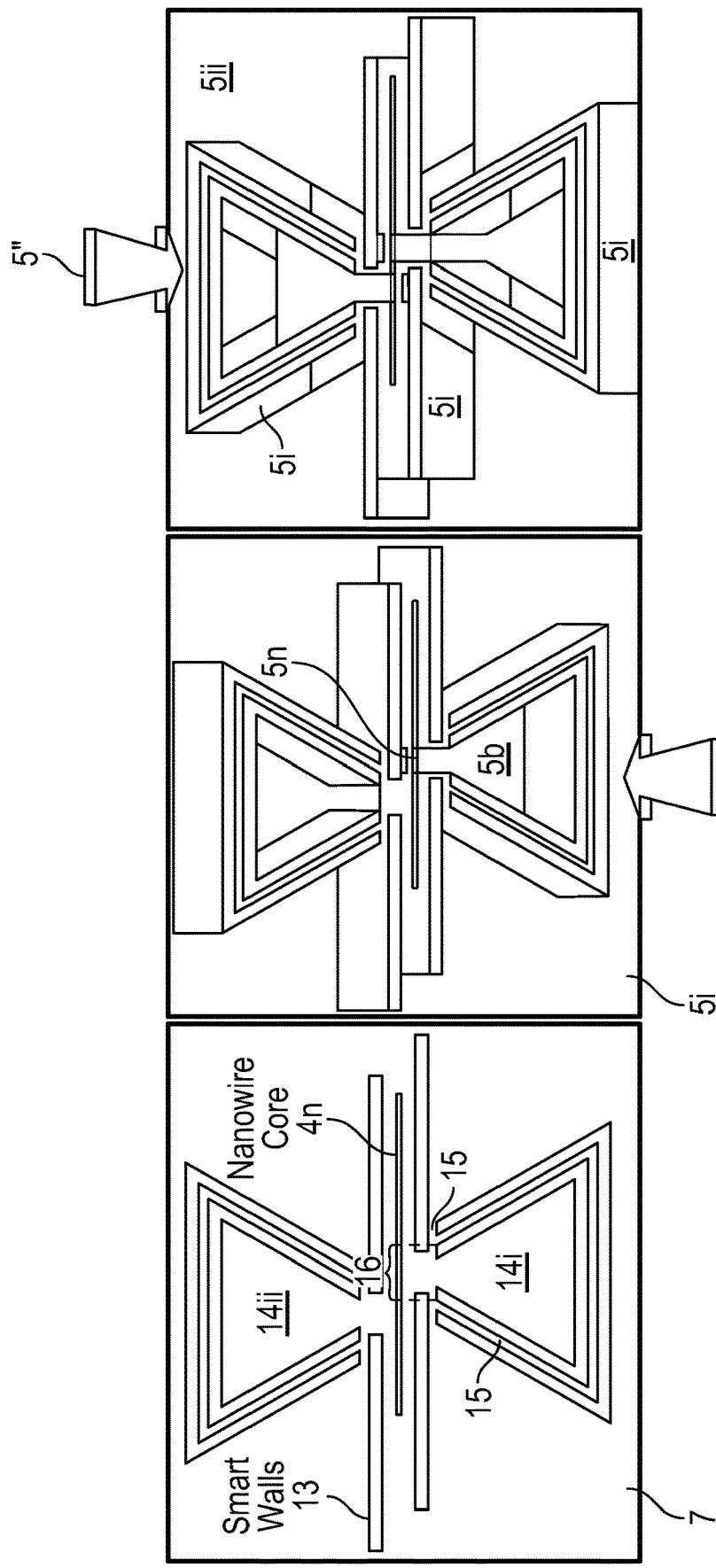
FIGS. 5A-5C are top-down views of an example of a dual angle deposition process.
Figure 6:
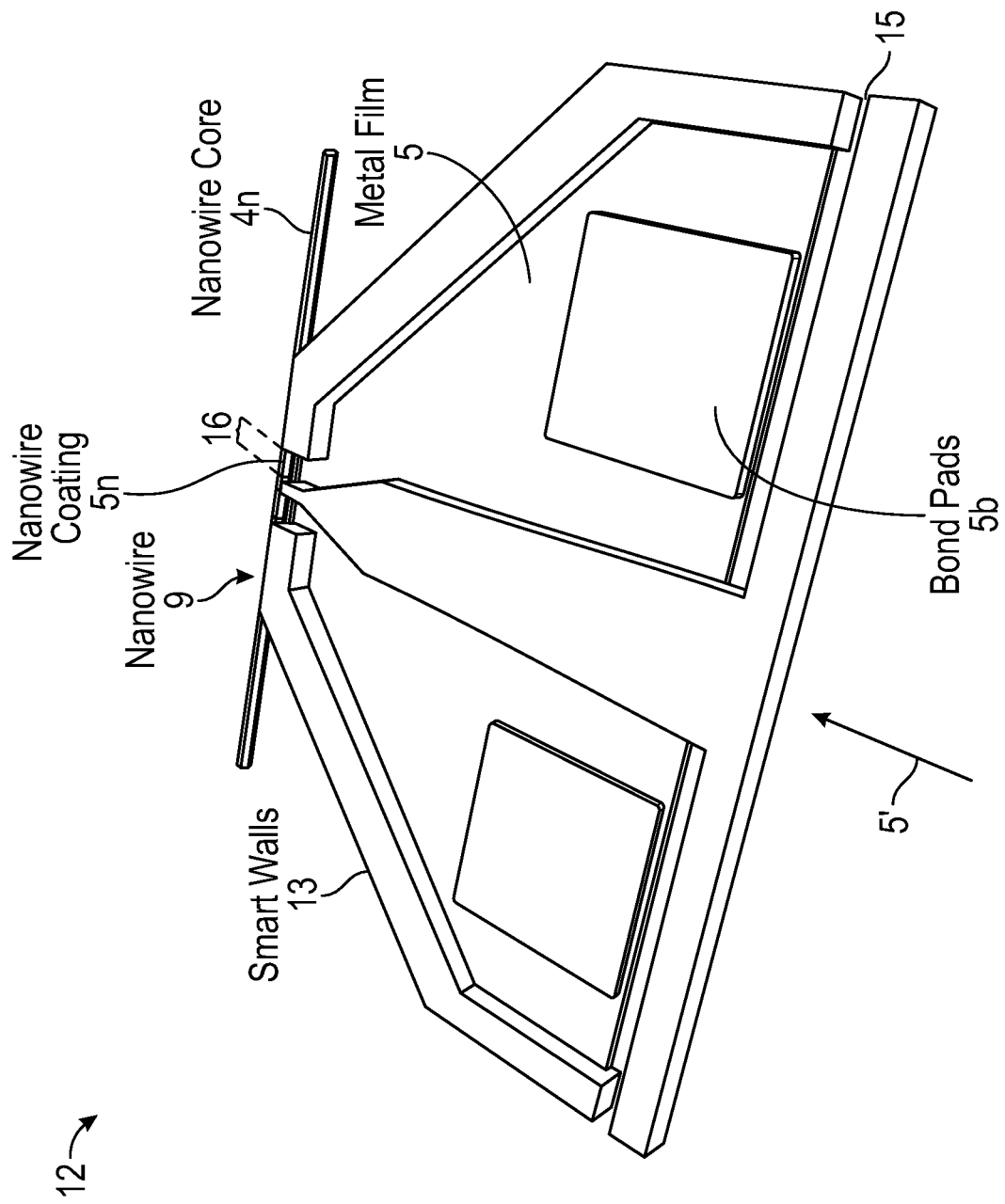
FIG. 6 is a schematic perspective view of an example wall structure.
Figure 7:
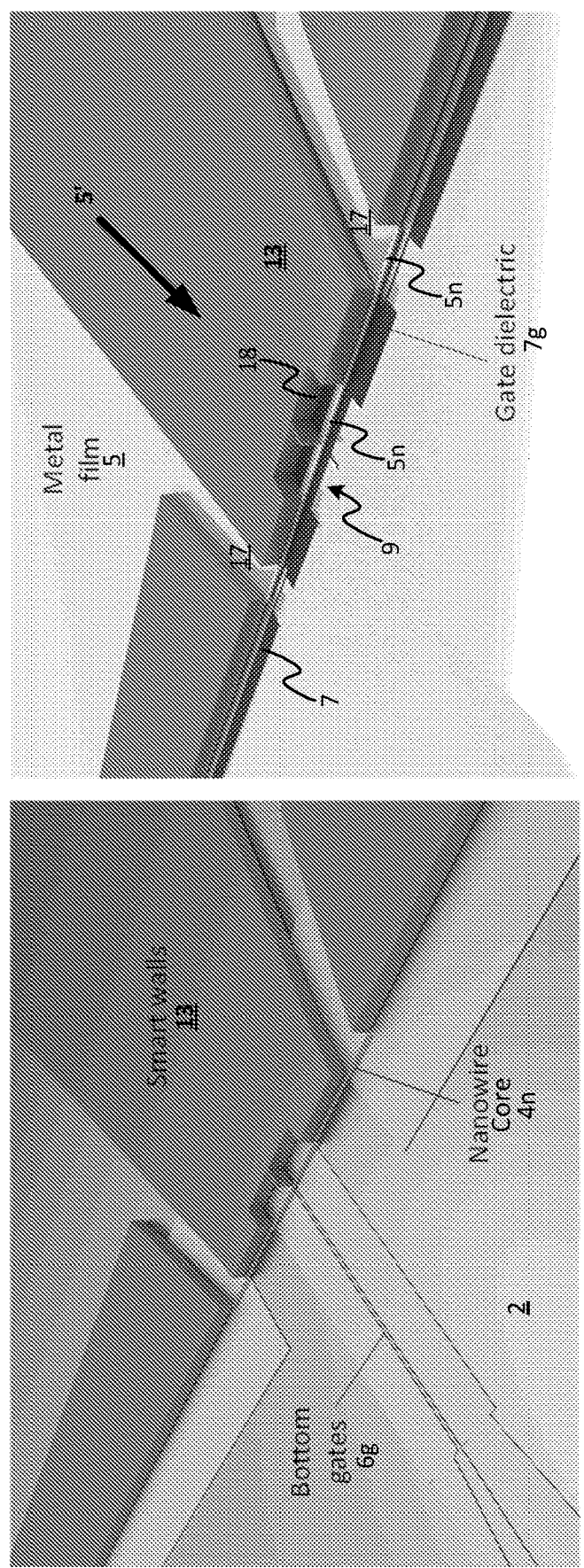
FIG. 7 is a schematic perspective view of another example wall structure.

Note that this superconductor (e.g. Al) coating 5n is only formed over a relatively small length of the semiconductor core of the nanowire, where the small opening of the pocket meets the semiconductor in FIG. 5 (and FIG. 6, or where the un-shadowed "cut-outs" in the walls meet the nanowire 9 in FIG. 7, to be discussed in more detail shortly).

Referring also to panel c), FIG. 5 also illustrates dual-angle deposition employing smart walls (shadow walls) 13 with gaps 15 on both sides of the nanowire 9. A double wall 13 is employed to avoid electrically shorting parts of the device.

A second pocket 14ii has its longest base arranged as a front wall facing a second deposition direction, being the direction of deposition of a second beam of metal vapour 5". In general this may be the same or a different kind of metal than deposited in the first beam. The shortest base (rear wall to the second direction) of the second pocket 14ii has an opening 16 which opens out onto another part of the nanowire core 4n. When the second beam of metal 5" is deposited, as shown in panel c), it not only forms a contact such as bond pad 5b in the second pocket 14ii, but also passes through the opening 16 and coats the corresponding part of the nanowire core 4n to form the superconducting coating 5n (similarly to the situation described in relation to the first pocket 14i, but in the opposite direction and coating another part of the length of semiconductor 4).

While the methodology with gaps 15 described above works for a single evaporation step, shorts can still occur when multiple depositions at different angles are performed, even when using gaps. Hence, the design may be modified to allow for multiple angles. In embodiments the modification made is to use double-wall structures, with both walls at a distance small enough to prevent metal deposition between them (again shorter than the shadow length). FIG. 5 depicts an example of this.

More generally, deposition of a metal or conductor 5 could be performed from any two or more different directions. Note that a given direction as referred to herein includes both the polar angle and the azimuthal angle. The polar angle is the angle of elevation relative to the plane of the substrate 2, or equivalently the angle formed with the normal to the substrate. The azimuthal angle is the angle in the plane of the substrate 2. The different deposition directions could comprise angles at different polar angles, azimuthal angles or both.

Using such methods, it is possible to make complex isolated patterns that contact the wire and nothing else on the chip 1, or even generate superconducting and normal contacts on the semiconducting wire that are electrically isolated from each other, as shown in FIGS. 5A-5C. In embodiments such as shown in these figures, this can be achieved by using two in situ evaporation steps with two different metals present in the deposition cluster (e.g., aluminium and gold) at two different evaporation angles (FIGS. 5B and 5C, from the top and the bottom of the picture, respectively). In FIGS. 5A-5C these are represented by 5i and 5ii. The deposition of the two different first and second metals in their vapour form are labelled 5' and 5" respectively. The corresponding first and second deposited films are labelled 5i and 5ii, respectively. If two evaporation angles are used, the designed wall structure may contain double walls similar to the ones of FIGS. 5A-5C in order to achieve full isolation between the metals 5i, 5ii.

FIG. 6 gives a schematic illustration of the smart walls 13 surrounding two bond pockets. Gaps 15 are incorporated to electrically isolate the metal films 5 inside the two pockets from one another as well as from the outside of the walls 13. The metal film 5 formed inside each of the pockets 5 comprises a bond pad 5b. The raised parts (in this case squares) shown inside the pockets 14 can be patterned previous to the nanowire deposition and then coated with the metal film 5 along with the rest of the metal layer. The reason for this is that wire bonding exerts force onto chip, so to avoid damage to the layers a relatively thick metal layer may be pre-fabricated in the bond pocket area. However this is optional and instead the floor of the pocket 14 forming the bond pad 5b could just be flat. Note also that FIG. 6 shows a variant of the idea behind the trapezoidal shape exemplified in FIGS. 4 and 5. In the case of FIG. 6 the shape is not a trapezoid but functions similarly. The longer, front walls of the pocket face the oncoming deposition beam 5'. The side walls taper backwards along at least part of their length. Also in this case two adjacent pockets share a central wall.

The pockets are isolated similarly to the previous example. The deposited metal 5 also covers at least some of the sides and the tops of the walls (though not shown as doing so in FIG. 6). However, this layout (which is only an illustrative schematic) avoids shorts between the two pockets 14. The central wall is tapered inwards. Thus, no metal 5 is deposited on either the left or on the right sides of the centre wall. Having some straight walls (as is the case here) can in some cases be a problem, for instance if the deposition is not perfectly directional and thus metal can cover the inner AND the outer side of the walls. However this is not necessarily a problem since the evaporation 5' can be made very directional.

The example of FIG. 6 also shows the idea of an opening 16 on the shorter rear wall, opening out onto the nanowire, for coating the nanowire core 4n and at the same time forming a contact between the nanowire coating 5n and the bond pad 5b in the pocket. However in the case of FIG. 6, this involves only a single deposition direction and corresponding pocket direction, as opposed to the dual disposition angle approach of FIG. 5. Except for the case of dual- or multi-angle deposition such as in FIG. 5, in embodiments the process requires only a single metal deposition step. The nanowires are semiconducting and the hybrid semi-/superconducting segments on the nanowire are created in this evaporation. An advantage of this method is that not only superconducting contacts but also effectively normalconducting contacts can be fabricated this way in a single deposition (the electrical superconducting contacts made from Al that are placed several micrometers away from the critical device effectively act as normalconducting leads).

In embodiments, following the post-fabless paradigm, the device 1 does not comprise top gates for electrostatically tuning the devices. Instead, it employs bottom and/or side gate structures that are fabricated prior to the smart walls 13 (as well as the nanowire deposition or growth), and which locally control the electrochemical potential of the nanowires from underneath. To connect these gates to the outside world, pockets 14 are created for wire bonding using the method described above (e.g. FIG. 5 or 6). Since the bottom gates are fabricated prior to the nanowire deposition or selective nanowire growth, the process allows for a higher thermal budget and for higher-quality dielectrics. If desired additional gates or metal leads can be guided from the device to these bond pockets through the shadowed area and the previously described gaps, providing electrical connection to the bond areas.

FIG. 7 shows an exemplary realization of hybrid semiconducting-superconducting structures separated by a normalconducting segment. The left-hand panel shows the wafer 1 before metal deposition, and the right-hand side after. Note that in the left-hand panel, the lower dielectric layer 7 is not shown so as to illustrate bottom gates 6g formed in the lower metal layer 6, but nonetheless the lower dielectric layer 7 will be understood to be present over the top of the lower metal layer 6. In embodiments the lower dielectric layer 7 is a uniform coating but it could alternatively be patterned, e.g. a patterned structure on top of the gates 6g. Pockets 14 are not shown in FIG. 7, but one or more such pockets may be formed in the large white regions marked "metal film 5", e.g. for connecting to the nanowire 9, e.g. in a similar manner as discussed in relation to FIGS. 4-6. FIG. 7 highlights the incorporation of bottom gates in the process flow (following the post-fabless approach).

In the example of FIG. 7, the wall structure 13 shadows most of the length of the semiconductor 4n that forms the core(s) of one or more nanowires, except that one or more channels 17 and/or cut-out regions 18 are left in the wall structure 13. These channels 17 and/or cut-outs 18 prevent corresponding sections of the semiconductor 4n being showed, and hence the deposition 5' coats these each of these sections with a metal coating 5n to form a respective semiconductor-superconductor nanowire 9. Further, the shadow is long enough to leave some parts of the lower dielectric layer 7 exposed, uncovered by the metal film 5.

Figure 8:
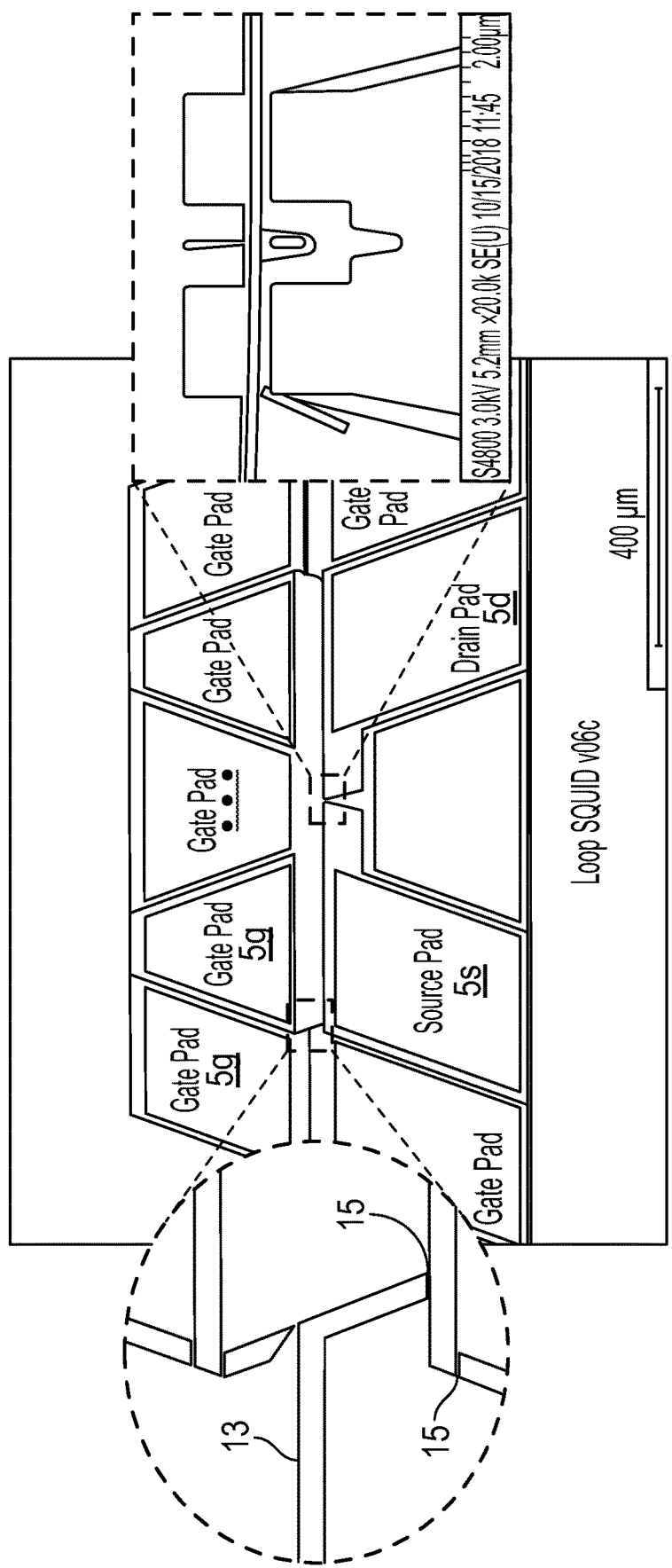
FIG. 8 is an SEM image of a wafer containing an example wall structure.

The gates 5g/6g are conducting and one can induce a topological phase in the nanowire 9 by applying appropriate voltages to the gates. These gates are however electrically isolated from the nanowire as the gates and the wire are physically separated by the gate dielectric (e.g. $Al_2O_3$, $HfO_2$, or $Si_3N_4$ or similar). They apply an electro static potential to the gates via an electric field that propagates through the dielectric. This is how most types of gates are implemented in research/industry. The electric field created by the potential on the gate locally changes the energy level of the nanowire 9, which is required to enable the phase transition. The normalconducting segment is the very narrow shadowed region at the centre of the nanowire In conclusion, the present disclosure has presented an approach that reduces the need for fabrication steps after the deposition or growth of the semiconductor layer and subsequent metal deposition (e.g. including the semiconducting nanowires), and in embodiments eliminates the need for any such steps altogether. By designing shadow wall structure, preferably using a small evaporation angle with respect to the substrate plane in combination with a vertical hard mask template, then the electrical contacts can be patterned onto the semiconductor structure 4 in a manner that keeps the contacts isolated from the global film 5 that lays on the substrate after evaporation. This will prevent or at least reduce the need for any fabrication on the chip after metal deposition. In embodiments the bottom or side gates also may be fabricated prior to the deposition or growth of the semiconductor If an in-situ dielectric capping method is possible in the deposition cluster, a device that is clean, protected and resilient against degradation and aging can be obtained, an achievement that is not possible with any of the usual fabrication designs and flows currently available. The disclosed process involves smart walls, and in embodiments a hard mask template. Such techniques enable complex hybrid nanowire devices to be fabricated without relying on additional nanofabrication steps. FIG. 8 shows a scanning electron microscope (SEM) image of a device containing smart wall networks with gaps and pads following a fabrication flow as described herein. It allows one to achieve electrically isolated contacts to the wire after metal deposition, avoiding metal etching. If bottom gates are introduced, no port-fabrication will be needed on this device. This last development is currently ongoing.

It will be appreciated that the above embodiments have been described by way of example only.

For instance, similar techniques could be applied to form any structure where it would be desirable to avoid or reduce potential damage by post-fabrications steps such as etching or lithography that are conventionally used to form the upper conducting structure. The disclosed techniques could be used to form other types of qubit or quantum device other than just MZM-based qubits based on semiconductor-superconductor nanowires. E.g. the semiconductor layer 4 could comprise components of other types of qubit or other quantum devices such as SIS junctions, SIN junctions and SQUIDS; or spintronic devices such as spin transistors, spin-based storage elements or spin-based sensing elements; or even conventional semiconductor components such as transistors.

The conducting material 5 used in the upper and/or lower conducting layers 6, 5 need not necessarily be a metal. More generally, it could comprise a superconductor or other conductor. It could comprise a metal, or another conductor such as a conducting polymer. In some embodiments the conducting material 5 being deposited in the angled deposition may even comprise a semiconductor. In embodiments multiple sublayers of different types of conducting material could be applied in different steps at different deposition angles.

In embodiments, any of the disclosed method could even be used for angled deposition of any type of material generally. For instance, in embodiments the angled deposition process could additionally be used to form one or other types of layer, e.g. a dielectric, in addition to the conducting material 5. For instance, the method may be used to evaporate a dielectric material such as $Al_2O_3$ as a gate dielectric, followed by a metal layer. Alternatively the deposited material 5 may comprise only another type of material, e.g. only a dielectric. This may be especially relevant in the case of the vertical template 10. For instance it could be desired to only want to deposit dielectric in the middle of the chip, and have some bond pads around this area without dielectric, where one can bond.

The semiconductor 4 may comprise any semiconductor material such as InAs, GaSb or InSb, including any kind of combination of these (e.g. $Ga_xIn_{1-x}As_ySb_{1-y}$), with or without any kind of doping (e.g. Bi, Te), of either single component or multi-component (e.g. multi-layer), in form of either nanoparticles, nanowires, films or bulk crystals. Or more generally still, the first or active layer 4 in which the circuit portions are formed prior to the angled deposition of the conducting material 5 need not necessarily comprise, or not solely comprise, a semiconductor material. In principle that layer 4 could also be some previously patterned material (e.g. dielectric or metal), that could even have been deposited using the shadow walls in a previous deposition step. For instance in the case for forming a layer of SIS quantum components, each component may comprise two metallic leads deposited on top of a piece of dielectric (forming the "I" part of the component) that is lying on or over the substrate 2.

Where a dielectric is used for any part of the device 1, this could be any of a variety of dielectric materials known to a person skilled in the art. Further, the shadow walls 13 are not limited to being formed from dielectric. E.g. the walls 13 may instead be made from a metal or a semiconductor. For instance, this actually enables some of the walls to be used as gates. To not run into the risk of having accidental shorts, and due to the ease of structuring thick layers of dielectric, then dielectrics may be preferred. However, this is not a fundamental issue. If designed appropriately the risk of having shorts is not much higher in case of a metallic smart wall. Moreover, there are also feasible fabrication techniques for metal etching.

It is also not excluded that other layers than those shown in the Figures could be present.

More generally, according to a first aspect of the present disclosure, there is provided a method of fabricating a device, comprising: providing a substrate defining a plane; forming portions of electronic circuitry over the substrate; forming a shadow wall structure over the substrate; and after forming said portions and the shadow walls, depositing an upper conducting layer over the substrate by angled deposition of a conducting material in at least a first deposition direction at an acute angle to the plane of the substrate, wherein the shadow wall structure is arranged to cast a shadow in the deposition, leaving areas where the conducting material is not deposited; wherein the shadow wall structure comprises one or more gaps each shorter than a shadow length of a respective part of the shadow wall structure casting the shadow into the gap, to prevent the conducting material forming in the gaps and to thereby create regions of said upper conducting layer that are electrically isolated from one another; and wherein said electrically isolated regions are arranged to form conducting elements for applying signals to, and/or receiving signals from, the electronic circuitry.

In embodiments, the conducting elements may comprise one or more of: one or more bond pads for connecting an external lead to one or more of the active components, one or more internal conducting lines connecting between two or more of the active components, and/or one or more gates for gating one or more of the portions of circuitry.

In embodiments, the method may comprise forming a lower structure over the substrate prior to forming said portions and shadow walls, the lower structure comprising a lower conducting layer and/or lower dielectric layer.

In embodiments, the conducting elements may comprise one or more bond pads connecting to the lower conducting layer, and/or one or more internal lines connecting between the lower conducting layer and one or more of said portions.

In embodiments the conducting material is a conductor. In embodiments the conductor may comprise a metal. Alternatively the conductor may comprise a conducting polymer. In embodiments the conductor may comprise a superconductor (e.g. Al). Alternatively the conductor may comprise a semiconductor.

In embodiments said portions of circuitry comprise portions of semiconductor. Alternatively or additionally said portions of circuitry may comprise one or more portions of dielectric.

In embodiments, the device being fabricated may comprise a topological quantum computing device comprising a network of semiconductor-superconductor nanowires, each nanowire comprising a length of semiconductor and a superconductor coating formed over at least part of the semiconductor. The portions of semiconductor may comprise said lengths of semiconductor. One or more of the electrical contacts may be arranged for applying signals to, and/or reading out from, one or more of the nanowires.

In embodiments, the conducting material may comprise a superconductor and said coating may comprise some of the superconductor deposited as part of said upper conducting layer, the conducting elements thus being formed as part of in the same angled deposition as the superconducting coating.

In embodiments, the shadow wall structure may comprise one or more partially enclosed pockets formed in the plane of the substrate, each comprising walls enclosing the region forming a respective one of said conducting elements within the walls of the pocket. The walls of each pocket may have one or more gaps for creating the electrical isolation, and optionally an opening for forming a connection to at least one of the portions of circuitry. In embodiments, preferably there are no other discontinuities in the walls of the pocket.

In embodiments, at least one of the pockets comprises no opening for forming a connection to any of the of the semiconductor components, but instead the respective conducting component connects to one or more of the portions of circuitry via the lower conducting layer.

In embodiments, at least one of the pockets may have a front wall facing the first deposition direction, a rear wall behind the front wall from perspective of the first deposition direction, and side walls joining the front and rear walls. The rear wall may be shorter than the front wall, and at least one of the side wall may tapers backwards at least part way between the front and rear walls so that the shadow of the at least one side wall prevents the conducting material being deposited on an outside of the at least one side wall.

In embodiments the rear wall may comprise said opening.

In embodiments the pocket may take the shape of a trapezoid, the front and rear walls being the parallel bases of the trapezoid and the side walls being the sides of the trapezoid.

In embodiments the front wall may be arranged to be substantially perpendicular to the direction of deposition (or at least one of the directions of deposition).

In embodiments, it may be that no etching or lithography steps are used to form any conducting layers after the forming of the portions of circuitry.

In embodiments, said depositing of the upper conducting layer over the substrate may be by angled deposition of a conducting material in each of a plurality of deposition directions each at an acute angle to the plane of the substrate, the shadow wall structure thus casting a plurality of respective shadows in the deposition. The gaps may be are shorter than the shadow length of the respective parts of the wall structure casting all of said plurality of shadows, to prevent the conducting material from being deposited in the gaps from any of said deposition directions.

The different directions may comprise different polar angles (perpendicular) and/or different azimuthal angle (in the plane of the substrate). In embodiments the directions may comprise at least first and second directions, or only first and second directions. The first and second directions may have opposite parallel azimuthal angles (opposite and parallel in the projection of the directions onto the plane of the substrate).

In embodiments, the angled deposition may comprise: forming a vertical template perpendicular to the substrate on one or more sides of the substrate, the vertical template comprising one or more holes corresponding to one or more areas in the plane of the substrate over which said deposition is to be performed given the angle of the deposition direction or directions relative to the substrate; and depositing said conducting material through the one or more holes in the deposition direction or directions, at the angle of each deposition direction, thereby depositing the conducting material over said one or more areas. The vertical template may either be left in place or removed when the device is subsequently capped.

According to a more general variant of the first aspect, there is provided a method of fabricating a device, comprising: providing a substrate defining a plane; forming portions of electronic circuitry over the substrate; forming a shadow wall structure over the substrate; and after forming said portions and the shadow walls, depositing an upper layer over the substrate by angled deposition of any material in at least a first deposition direction at an acute angle to the plane of the substrate, wherein the shadow wall structure is arranged to cast a shadow in the deposition, leaving areas where the conducting material is not deposited; wherein the shadow wall structure comprises one or more gaps each shorter than a shadow length of a respective part of the shadow wall structure casting the shadow into the gap, to thereby create discontinuous regions of said material. In embodiments, any of the features disclosed above may additionally be applied in conjunction with this definition of the first aspect.

According to a second aspect disclosed herein, there may be provided a method of fabricating a device by angled deposition, comprising: providing a substrate defining a plane; forming a vertical template perpendicular to the substrate, the vertical template comprising one or more holes corresponding to one or more areas in the plane of the substrate over which said deposition is to be performed given a direction of deposition at an acute angle to the plane of the substrate; and depositing a material through the one or more holes in said direction at said angle, thereby depositing the material over said one or more areas.

The first and second aspects may be used together of independently of one another. In embodiments, any feature described in relation to the first aspect may or may or may not be used in conjunction with the second aspect, and vice versa.

According to another aspect disclosed herein there is provided a device formed by any method disclosed herein.

According to another aspect disclosed herein there is provided a method of operating the device. The method may comprise: applying an internal or external magnetic field to one or more of the nanowires, and cooling the device to a temperature inducing superconductivity in the superconductor, in order to induce majorana zero modes, MZMs, in the one or more nanowires.

In embodiments, the inducement of the MZMs may further comprise gating the nanowires with an electrostatic potential applied via one of said conducting elements.

Other variants or use cases of the disclosed techniques may become apparent to the person skilled in the art once given the disclosure herein. The scope of the disclosure is not limited by the described embodiments but only by the accompanying claims.

The invention claimed is:

1. A method of fabricating a device, comprising:
providing a substrate defining a plane;
forming portions of electronic circuitry over the substrate;
forming a shadow wall structure over the substrate; and
after forming said portions and the shadow walls, depositing an upper conducting layer over the substrate by angled deposition of a conducting material in at least a first deposition direction at an acute angle to the plane of the substrate, wherein the shadow wall structure is arranged to cast a shadow in the deposition, leaving areas where the conducting material is not deposited;
wherein the shadow wall structure comprises one or more gaps each shorter than a shadow length of a respective part of the shadow wall structure casting the shadow into the gap, to prevent the conducting material forming in the gaps and to thereby create regions of said upper conducting layer that are electrically isolated from one another; and
wherein said electrically isolated regions are arranged to form conducting elements for applying signals to, and/or receiving signals from, the electronic circuitry.

2. The method of claim 1, wherein:
the device being fabricated comprises a topological quantum computing device comprising a network of semiconductor-superconductor nanowires, each nanowire comprising a length of semiconductor and a superconductor coating formed over at least part of the length of semiconductor;
the portions of semiconductor comprise said lengths of semiconductor; and
one or more of the electrical contacts are arranged for applying signals to, and/or reading out from, one or more of the nanowires.

3. A method of operating a device formed by the method of claim 2, the method of operating the device comprising:
applying an internal or external magnetic field to one or more of the nanowires and cooling the device to a temperature inducing superconductivity in the superconductor, in order to induce majorana zero modes (MZMs) in the one or more nanowires.

4. The method of claim 3, wherein the inducement of the MZMs further comprises gating the nanowires with an electrostatic potential applied via one of said conducting elements.

5. The method of claim 2, wherein the conducting material comprises a superconductor and said coating comprises some of the superconductor deposited as part of said upper conducting layer, the conducting elements thus being formed as part of in the same angled deposition as the superconducting coating.

6. The method of claim 1, wherein the shadow wall structure comprises one or more partially enclosed pockets formed in the plane of the substrate, each comprising walls enclosing the region forming a respective one of said conducting elements within the walls of the pocket; wherein the walls of each pocket have one or more gaps for creating the electrical isolation, and optionally an opening for forming a connection to at least one of the portions of circuitry, but no other discontinuities in the walls of the pocket.

7. The method of claim 6, comprising forming a lower structure over the substrate prior to forming said portions and shadow walls, the lower structure comprising a lower conducting layer and/or lower dielectric layer; wherein:
at least one of the pockets comprises no opening for forming a connection to any of the of the semiconductor components, but instead the respective conducting component connects to one or more of the portions of circuitry via the lower conducting layer.

8. The method of claim 6, wherein at least one of the pockets has a front wall facing the first deposition direction, a rear wall behind the front wall from perspective of the first deposition direction, and side walls joining the front and rear walls, wherein the rear wall is shorter than the front wall, and at least one of the side walls tapers backwards at least part way between the front and rear walls so that the shadow of the at least one side wall prevents the conducting material being deposited on an outside of the at least one side wall.

9. The method of claim 8, wherein the rear wall comprises said opening.

10. The method of claim 1, comprising forming a lower structure over the substrate prior to forming said portions and shadow walls, the lower structure comprising a lower conducting layer and/or lower dielectric layer.

11. The method of claim 10, wherein the conducting elements comprise one or more bond pads connecting to the lower conducting layer, and/or one or more internal lines connecting between the lower conducting layer and one or more of said portions.

12. The method of claim 1, wherein the conducting elements comprise one or more of: one or more bond pads for connecting an external lead to one or more of the active components, one or more internal conducting lines connecting between two or more of the active components, and/or one or more gates for gating one or more of the portions of circuitry.

13. The method of claim 1, wherein the conducting material is a metal.

14. The method of claim 1, wherein the conducting material is a superconductor.

15. The method of claim 1, wherein said portions comprise portions of semiconductor.

16. The method of claim 1, wherein no etching or lithography steps are used to form any conducting layers after the forming of the portions of circuitry.

17. The method of claim 1, wherein:
said depositing of the upper conducting layer over the substrate is by angled deposition of a conducting material in each of a plurality of deposition directions each at an acute angle to the plane of the substrate, the shadow wall structure thus casting a plurality of respective shadows in the deposition; and
the gaps are shorter than the shadow length of the respective parts of the wall structure casting all of said plurality of shadows, to prevent the conducting material from being deposited in the gaps from any of said deposition directions.

18. The method of claim 1, wherein the angled deposition comprises:
forming a vertical template perpendicular to the substrate on one or more sides of the substrate, the vertical template comprising one or more holes corresponding to one or more areas in the plane of the substrate over which said deposition is to be performed given the angle of the deposition direction or directions relative to the substrate;
and depositing said conducting material through the one or more holes in the deposition direction or directions, at the angle of each deposition direction, thereby depositing the conducting material over said one or more areas;
wherein the vertical template is either left in place or removed when the device is subsequently capped.

19. A device formed by the method of claim 1.

20. A method of fabricating a device by angled deposition, comprising:
providing a substrate defining a plane;
forming a vertical template perpendicular to the substrate, the vertical template comprising one or more holes corresponding to one or more areas in the plane of the substrate over which said deposition is to be performed given a direction of deposition at an acute angle to the plane of the substrate; and
depositing a material through the one or more holes in said direction at said angle, thereby depositing the material over said one or more areas.

* * * * *